(12) United States Patent
Frey et al.

(10) Patent No.: US 7,805,645 B2
(45) Date of Patent: Sep. 28, 2010

(54) DATA PROCESSING APPARATUS AND METHOD FOR TESTING STABILITY OF MEMORY CELLS IN A MEMORY DEVICE

(75) Inventors: Christophe Denis Lucien Frey, Meylan (FR); Nicolaas Klarinus Johannes van Winkelhoff, Villard-Bonnot (FR)

(73) Assignee: ARM Limited, Cambridge (GB)

( * ) Notice: Subject to any disclaimer, the term of this patent is extended or adjusted under 35 U.S.C. 154(b) by 345 days.

(21) Appl. No.: 12/007,578

(22) Filed: Jan. 11, 2008

(65) Prior Publication Data
US 2009/0183032 A1    Jul. 16, 2009

(51) Int. Cl.
G11C 29/00    (2006.01)
(52) U.S. Cl. ...................................................... 714/718
(58) Field of Classification Search ................... 714/718
See application file for complete search history.

(56) References Cited
U.S. PATENT DOCUMENTS
6,917,215 B2 *  7/2005  Ichikawa .................... 324/765
7,546,497 B2 *  6/2009  Jang ........................... 714/718
2005/0268185 A1 * 12/2005  Vinke et al. .................. 714/718
2008/0109682 A1 *  5/2008  Kim et al. ...................... 714/40

OTHER PUBLICATIONS

G. Mayer et al, "Design methods for attaining IBM System z9 processor cycle-time goals" *IBM J. Res. & Dev.*, vol. 51, No. 1/2, Jan./Mar. 2007, pp. 19-35.

* cited by examiner

*Primary Examiner*—James C Kerveros
(74) *Attorney, Agent, or Firm*—Nixon & Vanderhye P.C.

(57) ABSTRACT

A data processor includes a memory device having an array of memory cells for storing data values. Test circuitry executes one or more test patterns to detect any memory cells which may malfunction. Each test pattern causes a sequence of access requests to be issued to the memory device where the timing of the sequence is controlled by a test mode clock signal. Dummy read control circuitry is responsive at least to each write access request to generate an internal clock signal which has an increased frequency with respect to the test mode clock signal. The dummy read control circuitry performs, using the internal clock signal, a write operation to at least one memory cell based on a memory address specified by the write access request, followed by a dummy read operation to the same memory cell, serving to stress the memory cell with respect to cell stability.

14 Claims, 12 Drawing Sheets

FIRST EMBODIMENT OF DUMMY READ CONTROL CIRCUITRY

DATA PROCESSING APPARATUS AND METHOD FOR TESTING STABILITY OF MEMORY CELLS IN A MEMORY DEVICE

BACKGROUND OF THE INVENTION

1. Field of the Invention

The present invention relates to a data processing apparatus and method for testing the stability of memory cells in a memory device.

2. Description of the Prior Art

Memory devices are typically formed as an array of memory cells. Each memory cell is typically formed of a plurality of components such as transistors, and these individual components may be constructed in a variety of ways. One known approach involves forming the cells using transistors that have a body region insulated from a substrate. The body region comprises the channel material in which a channel is established between the source and drain of the transistor below the gate of the transistor. By using transistors having a body region insulated from the substrate, it has been found that this reduces the capacitive loading on the transistor terminals when compared with transistors formed from non-insulated technologies where the channel material is formed on a conducting substrate. This reduced capacitive loading can give rise to increased switching speed of the transistors and lower power dissipation.

One known technology that can be used to produce transistors having a body region insulated from the substrate is referred to as Silicon-On-Insulator (SOI) technology, where the SOI channel material is formed within a region of a thin superficial silicon layer above an oxide insulating layer and located under the gate of the transistor, reducing resistive leakage to the substrate and capacitive loading by the substrate. Consequently, this body region is not biased to any known voltage, and its voltage can vary depending on charges arising from diode leakage, coupling capacitance with the gate, drain or source, impact ionisation, etc. Additionally, the voltage on the body region becomes dependent on the previous circuit activity, which is typically referred to as the "history effect". This variation in voltage on the body region can have an impact on the behaviour of a memory cell constructed using such transistors, since any change in the body voltage will typically modify the threshold voltage of the transistor, thus modifying the current passing through the transistor and the switching speed of the transistor.

When such transistors are used to form the memory cells of a memory device, it has been found that the above-mentioned body region history effect can adversely affect the stability of memory cells in certain situations. It is important when producing memory devices for the individual memory cells to have the required stability to ensure effective retention of data (stability sometimes being measured in terms of static noise margin (SNM)), whilst also having required write-ability (WM) to ensure that new data values can be stored in the cells within the time period allowed for a write operation. Whilst the increased switching speed and low power dissipation characteristics resulting from the use of transistors having a body region insulated from the substrate clearly make the use of such transistors very attractive, it is important to detect the presence of any memory cells in the memory device whose stability is unacceptably adversely affected by the history effect, as otherwise those memory cells may fail in use. Typically, memory devices are constructed with a number of redundant memory cells which can be switched in in place of memory cells that are identified to be defective, and accordingly if such unstable memory cells could be identified at production time, redundant memory cells can be switched in in their place to ensure that the memory device will operate correctly.

Accordingly, it is known to perform a number of test procedures on memory devices at the time of production to seek to identify defective memory cells, one category of such defective cells being those whose stability drops below a predetermined level due to the earlier-mentioned history effect.

One type of test procedure that can be performed to seek to identify defective cells takes the form of a Built-In Self Test (BIST) procedure whereby a number of test patterns are executed to seek to detect defective cells. Each test pattern typically causes a sequence of access requests to be issued to the memory device. For transistors having a body region insulated from the substrate, it has been found that the stability of a memory cell constructed using such transistors is at its lowest point immediately after a write operation takes place, and over time the voltage on the body region will re-stabilise increasing the stability of the memory cell. In normal use, this instability of the memory cell at the end of a write operation could in some cells cause a failure of the memory cell if a read operation occurs to that memory cell immediately following the write operation. Whilst that read operation may itself correctly read the data, it may cause the data value stored in the memory cell to flip during the read operation, such that a subsequent read operation from the memory cell would obtain incorrect data.

To keep test time and cost to a minimum, it is desirable to use test patterns which can be used to detect a variety of defects in the memory device. Accordingly, when testing for the above cell stability problem, one known prior art technique involves using pre-existing test patterns developed to detect other defects. Whilst such test patterns may write to a particular memory cell and then later in the test read from that memory cell a first time, and later read from that memory cell a second time, hence implementing the write, read, read pattern required to detect unstable memory cells, the amount of time between the initial write operation and the first read operation will vary dependent on the particular test pattern used. The longer the gap between the initial write operation and the first of the subsequent read operations, the more the voltage on the body region will have re-stabilised increasing the stability of the memory cell, and hence the less likely the memory cell will be to flip. Accordingly, using such pre-existing test patterns, the worst case stability situation due to history effects will not in fact be present, and accordingly such an approach will not identify all of the memory cells that may malfunction in use due to stability problems caused by the history effect.

An alternative approach would be to develop a dedicated test pattern solely for testing the stability problem introduced by the history effect. In particular, a test pattern could be developed where every write operation is immediately followed by two read operations at the same address (or at least the first read operation immediately follows the write operation). However, as mentioned earlier, in many applications it will often be determined to be too expensive to develop a dedicated test pattern just for testing this particular stability problem, both in terms of the time taken to produce the separate test pattern, and also the increase in overall test time taken for each memory device as a result of having to execute this additional separate test.

An alternative approach developed by IBM is referred to by IBM as a "flood mode" used to test stability in SOI transistors. In accordance with the flood mode, a write operation begins in the usual manner by selecting a particular word line in the memory array, and then lowering the voltage on one of the bit lines connected to an addressed column in the memory array. However, when the write operation is completed, whilst the bit lines are then precharged back to a logic one level in the usual way for a write operation, the word line continues to be enabled, as a result of which a condition arises where both of the bit lines are precharged to the logic one voltage level and the word line is still enabled. This represents the most unstable situation having regards to the history effect. Accordingly, this condition is maintained for a predetermined period of time, and if the memory cell's stability is below an acceptable level, it is likely that the data value in the cell will flip during the duration of the flood mode. Subsequently, the data stored in the memory cell is subjected to a read operation, and it is determined whether the data value read from the memory cell is the same as the data value written to the memory cell. If not, the memory cell is identified as defective.

There are a number of problems with this approach. One drawback is that the stressing of the memory cell depends on the duration of the flood mode, and this timing is difficult to tune on silicon. If the flood mode is maintained for too short a period of time, some unstable memory cells will not be detected, and conversely if the flood mode is maintained for too long, more memory cells will be detected than would actually fail in normal operation. Furthermore, due to the time spent at the end of each write operation to implement the flood mode, such an approach gives rise to a test operation that is more lengthy than desired.

Whilst memory cells constructed using SOI transistors or the like can have cell stability problems, since as a result of the body region history effect the cell instability is at its worst immediately following a write operation, and subsequently improves over time, such cell stability problems are not limited to memory cells using such transistors, and more generally the above problems can manifest themselves in association with any memory cells where the cell stability is adversely affected by a write operation.

Accordingly, it would be desirable to provide an improved technique for testing the stability of memory cells in a memory device, and in particular for testing for cell instability following a write operation.

SUMMARY OF THE INVENTION

Viewed from a first aspect, the present invention provides a data processing apparatus comprising: a memory device having an array of memory cells for storing data values; test circuitry employed in a test mode of operation to execute one or more test patterns in order to detect any memory cells which may malfunction in a normal mode of operation due to cell instability following a write operation, each test pattern causing a sequence of access requests to be issued to the memory device whose timing is controlled by a test mode clock signal; and dummy read control circuitry employed in the test mode of operation, and responsive at least to each write access request in the sequence of access requests to generate an internal clock signal which has an increased frequency with respect to the test mode clock signal, the dummy read control circuitry further being responsive to each write access request to perform using the internal clock signal a write operation to at least one memory cell based on a memory address specified by the write access request, followed by a dummy read operation to the same at least one memory cell, the dummy read operation serving to stress the at least one memory cell with respect to cell stability.

In accordance with the present invention, dummy read control circuitry is provided to alter the actions undertaken within the memory device in response to a write access request issued as part of a test pattern in the test mode of operation. In particular, the dummy read control circuitry generates an internal clock signal which has an increased frequency with respect to the test mode clock signal, and in response to a write access request causes a write operation to be performed to at least one memory cell based on a memory address specified by the write access request, followed by a dummy read operation to the same at least one memory cell. It is important to note that this dummy read operation has not been specified by the test pattern and the test circuitry does not use the result of the dummy read operation in any way. Indeed, in one embodiment, the dummy read operation will be hidden to those parts of the data processing apparatus external to the memory device. However, since the dummy read operation is performed immediately following the write operation, the read operation occurs at a time when the stability of the addressed memory cell(s) is at its lowest point. If a memory cell subjected to such a dummy read operation may in normal use become unacceptably unstable following a write operation, hence giving the potential for a failure of the memory cell, then this dummy read operation will cause the stored state of the memory cell to flip. If such a flipping of the memory cell occurs, then this can be detected by a later read operation to that memory cell performed as part of the one or more test patterns executed by the test circuitry, since when that later read operation occurs, the data value read will be different to the data value that had previously been written to that memory cell.

Accordingly, through use of the present invention, a dummy read operation is performed to a memory cell that has just been written to, at a time when that memory cell is at its most unstable, and hence this dummy read operation serves to stress that memory cell with respect to cell stability. Accordingly, if there was a possibility that that memory cell could fail in normal operation due to cell instability following a write operation, then the use of this dummy read operation during the test mode of operation will cause that memory cell to fail, and accordingly be detected as a defective memory cell by the test circuitry when a later read operation is performed during execution of the one or more test patterns.

Furthermore, since the dummy read operation is performed directly by the dummy read control circuitry, the dummy read control circuitry in effect replacing every write operation specified by the one or more test patterns with a write operation and a dummy read operation (this being facilitated by creating an increased frequency internal clock signal), there is no need to produce a dedicated test pattern purely for testing the particular stability problem arising from cell instability after a write operation, and instead this particular stability problem can be effectively tested using known test patterns that will also be used to identify other defects in the memory device. Since the dummy read operation immediately follows each write operation, the test reliably simulates the worst case situation that could arise in normal use and hence can reliably identify defective cells.

Hence, the solution of the present invention provides a very reliable and effective mechanism for detecting memory cells which may malfunction in normal use due to cell instability after a write operation, without the cost of developing a dedicated test pattern solely for testing that stability problem, and without any significant increase in test time. Thus, whereas some of the prior art techniques have cost or time implications which make them unrealistic to use in many test systems, the technique of the present invention does not suffer from such problems and hence provides a much more realistic approach for testing for the presence of such unstable memory cells.

Cell instability immediately following a write operation (with the cell then becoming more stable over time) may occur in a variety of types of memory cells. However in one embodiment, each memory cell comprises at least one transistor having a body region insulated from a substrate, and the cell instability following a write operation is caused by body region history effect. In one particular example, the memory cells are formed from SOI transistors.

The dummy read control circuitry may be arranged in a variety of ways. However, in one embodiment, the dummy read control circuitry comprises: clock frequency multiplying circuitry for generating the internal clock signal from the test mode clock signal; and write control signal generation circuitry for generating, from the internal clock signal and from a write enable signal provided with each write access request, an internal write enable signal, the internal write enable signal being set for at least one cycle of the internal clock to cause said write operation to be performed, and being cleared for at least one subsequent cycle of the internal clock to cause said dummy read operation to be performed. In one particular embodiment, the internal write enable signal is set to a logic zero level, and then cleared to a logic one level, but it will be appreciated that in alternative embodiments the write enable signal could be set to a logic one level and cleared to a logic zero level.

The clock frequency multiplying circuitry may generate the internal clock signal in a variety of ways. In one particular embodiment, the clock frequency multiplying circuitry is formed as clock pumping circuitry for generating the internal clock signal from the supplied test mode clock signal.

In one embodiment, the clock frequency multiplying circuitry generates the internal clock signal having a frequency twice that of the test mode clock signal. This hence provides sufficient time for the write operation and dummy read operation to be performed within the time that the test circuitry expects the write access request specified in the test pattern to be performed.

In one particular embodiment, the test mode clock signal is half the frequency of a normal mode clock signal used in the normal mode of operation. As a result, when the internal clock signal is arranged to have a frequency twice that of the test mode clock signal, it will be appreciated that the internal clock signal actually replicates the frequency of the normal mode clock signal, and hence provides a particularly accurate mechanism for detecting the memory cells which may malfunction in normal use due to the earlier-mentioned cell stability problem.

The number of internal clock cycles used to perform the write operation, and the number of internal clock cycles used to perform the dummy read operation, can be varied dependent on embodiment. However, in one embodiment, the internal write enable signal is set for a first cycle of the internal clock to cause said write operation to be performed, and is cleared for a second cycle of the internal clock to cause said dummy read operation to be performed. Hence, the write operation is performed in one cycle of the internal clock and the dummy read operation is performed in the next cycle of the internal clock.

There are a number of ways in which the clock frequency multiplying circuitry may generate the internal clock signal. In one embodiment, the clock frequency multiplying circuitry makes use of a write self timing signal generated within the memory device to indicate completion of the write operation, and uses that write self timing signal in combination with the supplied test mode clock signal in order to generate the internal clock. In an alternative embodiment, the clock frequency multiplying circuitry comprises edge detection circuitry for detecting both rising and falling edges of the test mode clock signal, and for generating the internal clock in dependence on said detected rising and falling edges.

There are a number of ways in which the test circuitry may identify defective memory cells whose state has been caused to flip following the earlier-mentioned dummy read operation(s). In one embodiment, the one or more test patterns specify a sequence of write access requests to a plurality of memory cells, and specify an associated sequence of read access requests to said plurality of memory cells, for each memory cell in said plurality the specified write access request being performed before the specified read access request. For any memory cell amongst said plurality for which the data read from that memory cell as a result of the specified read access request differs from the data written to that memory cell as a result of the specified write access request, said test circuitry determines that memory cell to be a memory cell which may malfunction in the normal mode of operation due to cell instability following a write operation. Hence, if the dummy read operation performed immediately after the write operation specified by a write access request causes the stored state to flip, then this will be detected by a subsequent read operation, in particular when the test circuitry compares the data value read as a result of that read operation with the data value that had been written as a result of the earlier write operation.

In one embodiment, the dummy read control circuitry only generates the increased frequency internal clock signal for write access requests specified by the one or more test patterns, and any read access requests are performed in accordance with the frequency of the test mode clock signal. However, in an alternative embodiment, the dummy read control circuitry generates the increased frequency internal clock signal for both the write access requests and the read access requests specified by the one or more test patterns. Due to the increased frequency of the internal clock signal with respect to the test mode clock signal, this will mean that more than one read operation is performed in response to each read access request. In particular, in one embodiment, the dummy read control circuitry is then responsive to each read access request to perform using the internal clock signal a first read operation from at least one memory cell based on a memory address specified by the read access request, followed by a further read operation from the same at least one memory cell. However, if the test circuitry were to compare the data value read by this further read operation with the data value previously written to the memory cell, it may the case that these two values are the same even though the memory cell in question was unacceptably unstable. In particular, if the dummy read operation following the original write operation caused the state to flip, and then the first read operation of the read access request also caused the state to flip, it will be appreciated that the data value obtained by the further read operation may match the originally written data value even though the cell should be identified as defective.

With this in mind, in accordance with one embodiment of the present invention where the increased frequency internal clock signal is used for both the write access requests and the read access requests, then for any memory cell for which the dummy read control circuitry detects a difference in the data read by the first read operation and the data read by the further read operation, the dummy read control circuitry is arranged to issue a fail signal to the test circuitry. For any memory cell for which the dummy read control circuitry issues the fail signal, the test circuitry determines that memory cell to be a memory cell which may malfunction in the normal mode of operation due to cell instability following a write operation, even if the data read by the further read operation is not different to the data written to that memory cell as a result of the specified write access request. By such an approach, the increased frequency internal clock signal can be generated for both write access requests and read access requests (which can potentially lead to a simpler implementation than if the increased frequency internal clock signal were only to be used for write access requests), whilst still ensuring that any memory cells that may malfunction in the normal mode of operation due to cell instability are identified.

The dummy read control circuitry may be provided externally to the memory device or may be provided within the memory device, for example within the interface circuitry of the memory device. In one embodiment, the dummy read control circuitry is provided within the memory device, this avoiding the need to alter the external interface to the memory device.

Viewed from a second aspect, the present invention provides a memory device comprising: an array of memory cells for storing data values; and dummy read control circuitry; in a test mode of operation, one or more test patterns being executed in order to detect any memory cells which may malfunction in a normal mode of operation due to cell instability following a write operation, each test pattern causing a sequence of access requests to be issued to the memory device whose timing is controlled by a test mode clock signal; and the dummy read control circuitry being responsive at least to each write access request in the sequence of access requests to generate an internal clock signal which has an increased frequency with respect to the test mode clock signal, the dummy read control circuitry further being responsive to each write access request to perform using the internal clock signal a write operation to at least one memory cell based on a memory address specified by the write access request, followed by a dummy read operation to the same at least one memory cell, the dummy read operation serving to stress the at least one memory cell with respect to cell stability.

Viewed from a third aspect, the present invention provides a method of testing stability of memory cells in a memory device, the memory device having an array of memory cells for storing data values, the method comprising the steps of: in a test mode of operation, executing one or more test patterns in order to detect any memory cells which may malfunction in a normal mode of operation due to cell instability following a write operation, for each test pattern a sequence of access requests being issued to the memory device whose timing is controlled by a test mode clock signal; responsive at least to each write access request in the sequence of access requests, generating an internal clock signal which has an increased frequency with respect to the test mode clock signal; and responsive to each write access request, performing using the internal clock signal a write operation to at least one memory cell based on a memory address specified by the write access request, followed by a dummy read operation to the same at least one memory cell, the dummy read operation serving to stress the at least one memory cell with respect to cell stability.

Viewed from a fourth aspect, the present invention provides a data processing apparatus comprising: memory means having an array of memory cell means for storing data values; test means employed in a test mode of operation for executing one or more test patterns in order to detect any memory cell means which may malfunction in a normal mode of operation due to cell instability following a write operation, each test pattern causing a sequence of access requests to be issued to the memory means whose timing is controlled by a test mode clock signal; and dummy read control means employed in the test mode of operation, and responsive at least to each write access request in the sequence of access requests for generating an internal clock signal which has an increased frequency with respect to the test mode clock signal, the dummy read control means further responsive to each write access request for performing using the internal clock signal a write operation to at least one memory cell means based on a memory address specified by the write access request, followed by a dummy read operation to the same at least one memory cell means, the dummy read operation serving to stress the at least one memory cell means with respect to cell stability.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
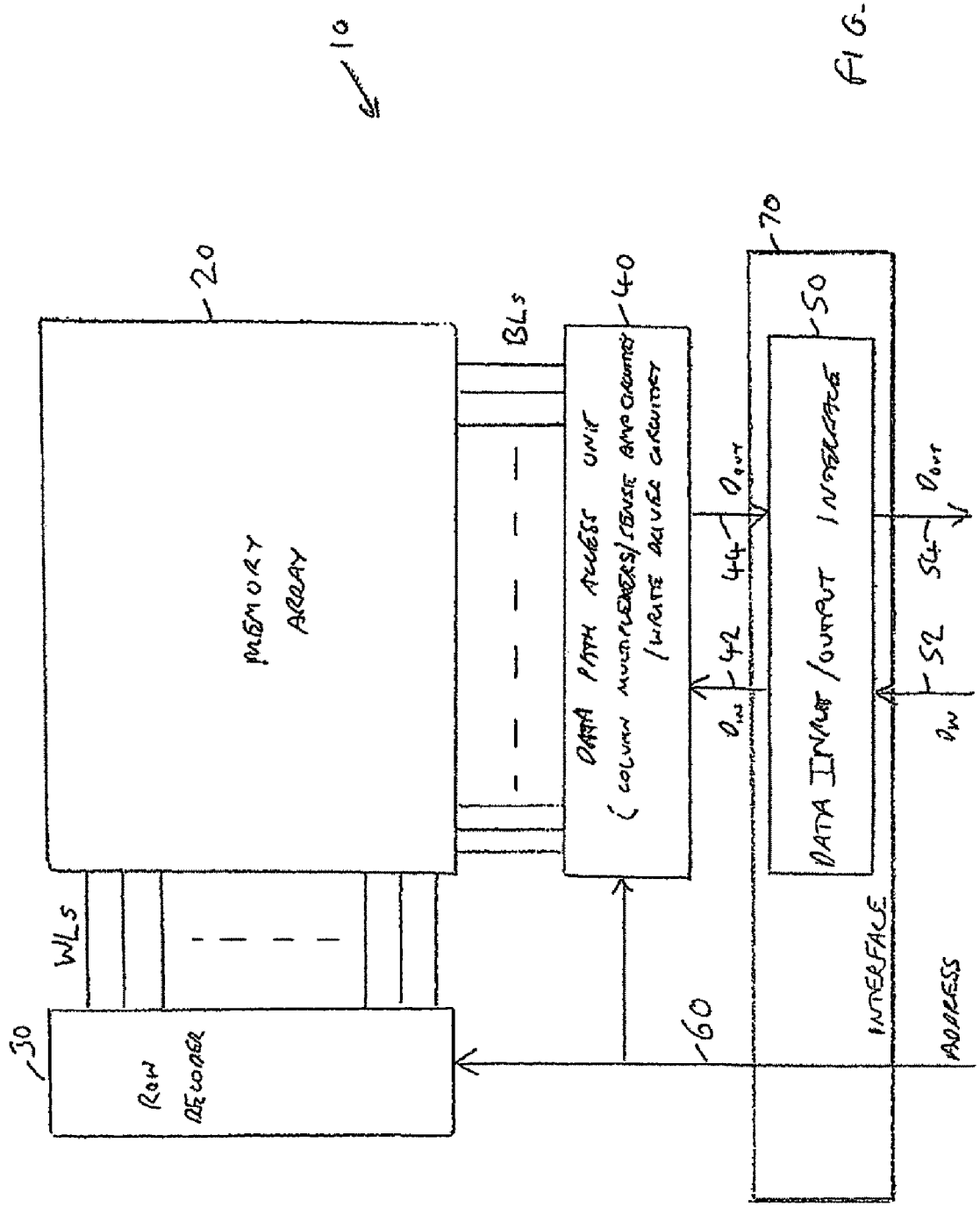
FIG. 1 is a block diagram of a memory device in accordance with one embodiment of the present invention.

FIG. 1 is a block diagram of a memory device in accordance with one embodiment of the present invention may be employed. The memory device 10 has a memory array 20 consisting of a plurality of memory cells arranged in rows and columns. Each row has a word line (WL) connected thereto, and each column has at least one bit line (BL) connected thereto, the exact number of bit lines connected to each column being dependent on the implementation. In one example implementation, the memory array consists of SRAM cells, and a pair of bit lines are connected to each column of cells.

When a memory access request is received by the interface 70 of the memory device, the address specified by the memory access request is routed over path 60 to a row decoder 30 and to a data path access unit 40. The row decoder 30 is arranged to decode the address and dependent thereon drive a control signal over one of the word lines in order to select one of the rows within the memory array 20. Similarly, the data path access unit 40 is arranged dependent on the address to identify the column or columns containing the data to be accessed, and to activate the respective bit lines.

Typically each memory cell stores a single bit data value, and accordingly if the data being accessed is a multi-bit data word (e.g. 32 bits, 64 bits, etc), it will be necessary to access multiple memory cells. In a typical design, column multiplexers will be provided corresponding to each bit of the data word, each column multiplexer being connected to the bit lines for a plurality of columns containing memory cells in which the associated bit of the data word can be stored. The memory array can hence be considered to be formed of a plurality of sections, one for each column multiplexer. Hence, by way of example a memory array may have 512 word lines, a multiplexer size of 4 (meaning 4 columns are connected to each multiplexer), and a data word size of 32 bits (meaning there are 32 column multiplexers, each column multiplexer being connected to a corresponding section of the memory array). Such a memory can hence store 2048 32-bit data words.

For a read operation, the relevant word line is enabled via the row decoder, the appropriate bit lines are activated by being selected via the column multiplexers, and then sense amplifier circuitry is used to observe variation on the voltage of the bit lines in order to determine for each addressed memory cell the bit value stored therein. In particular, considering the earlier-mentioned SRAM example where a pair of bit lines are connected to each memory cell, these bit lines will initially be precharged to a power supply voltage level, and when the relevant row of cells are selected via a drive signal on the relevant word line, one of the pair of bit lines connected to an addressed memory cell will start to discharge towards a ground voltage level, which of the bit lines in the pair discharges being dependent on the bit value stored therein. For each addressed memory cell (one addressed memory cell per column multiplexer), the discharging of one of the bit lines in the pair is sensed by the sense amplifier circuitry, which then produces an output signal over path 44 indicating the data word stored in the addressed memory cells. The output signal is then routed via the data input/output interface 50 of the interface circuitry 70 over path 54 to be returned as the read data to the source of the read access request.

For a write access request, the row decoder 30 operates in the same manner to select the relevant row by issuing a drive signal on the associated word line, and then for each section of the memory array write driver circuitry in the data path access unit 40 is used to alter the voltage on the relevant bit line or bit lines in order to cause the state held in the addressed memory cells to be updated to reflect the data word being written. Hence, the write data is routed over path 52 to the data input/output interface 50 and from there over path 42 to the data path access unit 40. The write data will then be used to generate the appropriate control signals for the write driver circuitry to cause the voltage on the relevant bit lines to be altered to cause the state of the addressed memory cells to be updated. Hence, again considering the earlier-mentioned SRAM example, both of the bit lines associated with a particular addressed memory cell will initially be precharged, and dependent on the data to be written, one of the bit lines in the pair will be discharged by the write driver circuitry to cause the state in the addressed memory cell to be updated.

Figure 2:
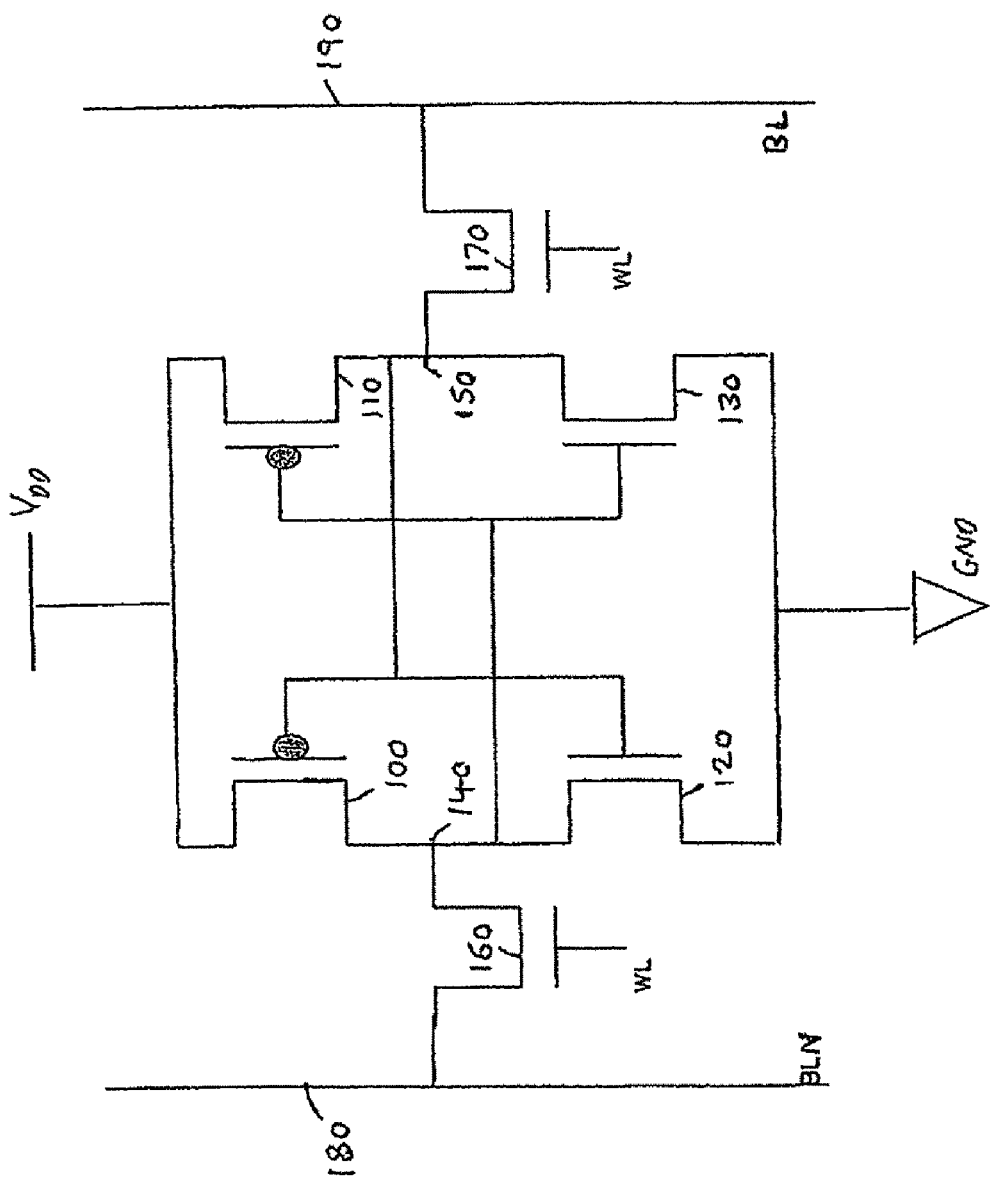
FIG. 2 is a diagram illustrating an example construction of a memory cell that may be used within the memory array of FIG. 1.

The memory cells of the memory device can take a variety of forms. However, by way of example, FIG. 2 is a diagram illustrating an example construction of a memory cell that may be used in an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The bit line 180 is connected to the node 140 via an access transistor 160, and similarly the bit line 190 is connected to the node 150 via an access transistor 170.

Two different states can be stored within the memory cell shown in FIG. 2, a first state being where the node 140 is at a ground potential and the node 150 is at a supply potential $V_{DD}$, and the second state being a state where the node 140 is at the supply potential $V_{DD}$ and the node 150 is at the ground potential.

Figure 3:
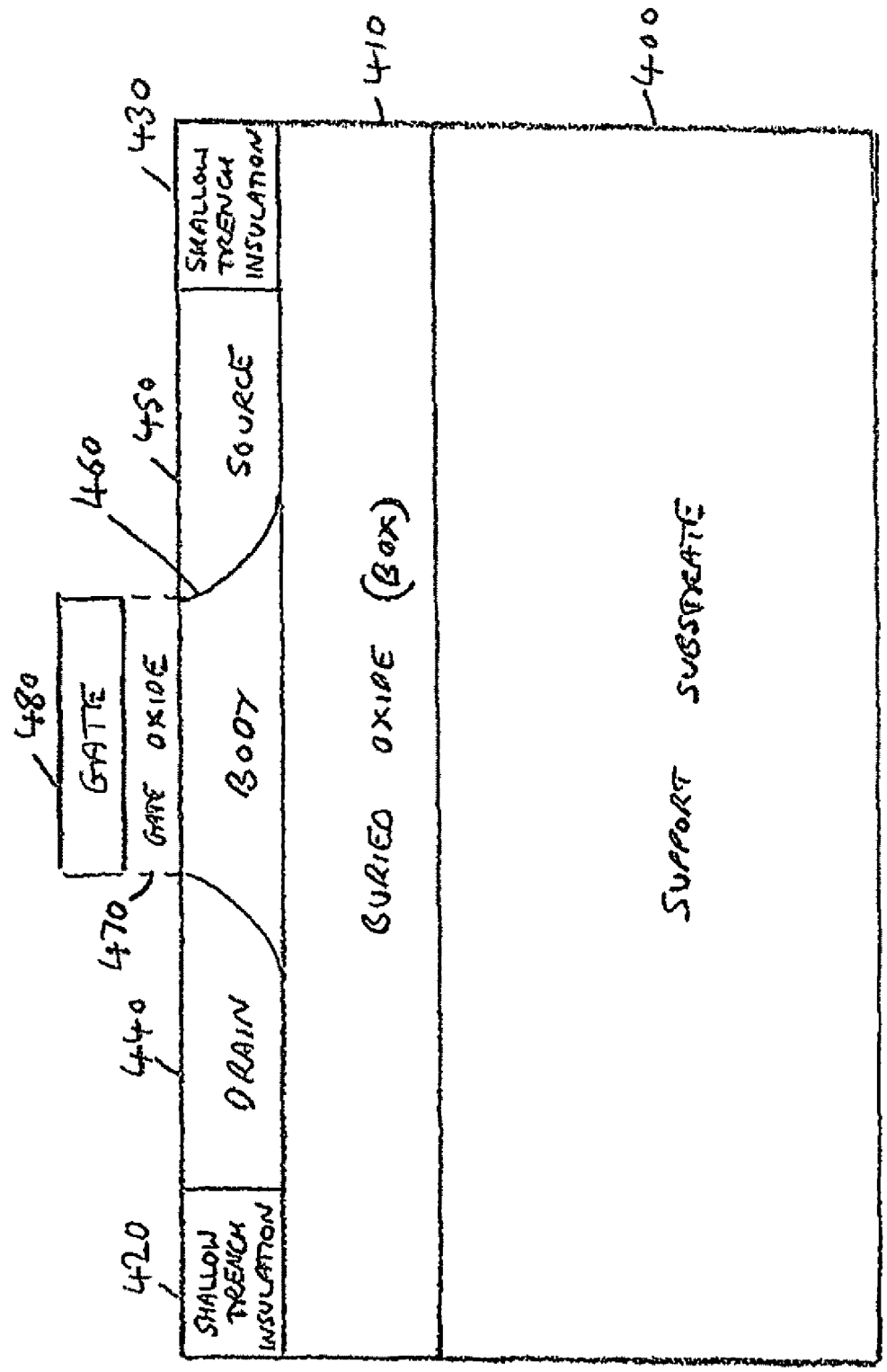
FIG. 3 is a simplified cross-sectional view of a transistor constructed using SOI technology.

The various transistors used to form the cells of the memory array can be constructed in a variety of ways, but in accordance with one known technique the transistors are constructed using SOI technology, which produces a body region which is insulated from the substrate. This is illustrated schematically in FIG. 3, which provides a simplified cross-sectional view through such an SOI transistor. As shown in FIG. 3, a buried oxide (BOX) region 410 is typically provided on a support substrate 400, and then the transistor is formed within a region above the BOX layer, the extent of that region being defined by shallow trench insulation regions 420, 430 at either side of that region. The "body" 460 of an SOI transistor is then formed by channel material that remains after the drain and source complementary material has been added to define the drain and source regions 440, 450, respectively. A gate 480 is then provided over the body region, and separated from the body region via a gate oxide layer 470.

For an N-channel transistor the body 460 is generally P type material and the source and drain are both formed from N+ type material. Similarly, for a P-type transistor, the body is generally N type material and the source and drain are both formed from P+ type material.

As mentioned previously, such SOI transistors can exhibit reduced resistive leakage to the substrate and capacitive loading by the substrate, giving rise to faster operation and lower power dissipation when compared with transistors constructed using non-insulated technologies that form the channel material on a conducting substrate. However, as also discussed previously, there is a possibility that the history effect might adversely affect cell stability. The reason for this can be illustrated by way of example with reference to FIG. 2. The stability of the memory cell illustrated in FIG. 2 is dependent on the strength of the pass gates 160, 170 and the NMOS pull down transistors 120, 130. In particular, the stronger the pull down transistors 120, 130 and the weaker the pass gate transistors 160, 170, the more stable the memory cell will be. If we consider the situation where the node 140 is originally at a logic one value, and according the node 150 is at a logic zero value, then considering the pass gate transistor 160, it will be appreciated that prior to the start of a write operation both the drain and source are at a logic one level (the bit line BLN 180 having been pre-charged to the logic one level). Accordingly, the body region of the pass gate transistor 160 is at as high a potential as possible, which makes the transistor's threshold voltage low, and accordingly makes the pass gate strong. Accordingly, this lowers the stability of the memory cell.

If a write operation then causes the stored state of the memory cell to flip, so that the internal node 140 is now at a logic zero level, then immediately following the write operation, the voltage potential on the body region will not have had an opportunity to change significantly. Over time, the potential of the body region in the pass gate transistor 160 will stabilise out to a lower voltage level, increasing the threshold voltage and accordingly making the pass gate weaker, thus making the cell more stable. However, if a read operation is performed immediately following the write operation, the memory cell will still be unstable, and it is possible that this read operation could corrupt the stored value in the memory cell (by causing the state to flip again).

Accordingly, to enable all memory cells that may malfunction in normal use due to cell instability to be detected in a test procedure, it is important that a read operation is performed immediately after a write operation, since this represents the most unstable state of the memory cell and hence is the correct stress condition to place the memory cell in in order to accurately detect such errors.

Figure 4:
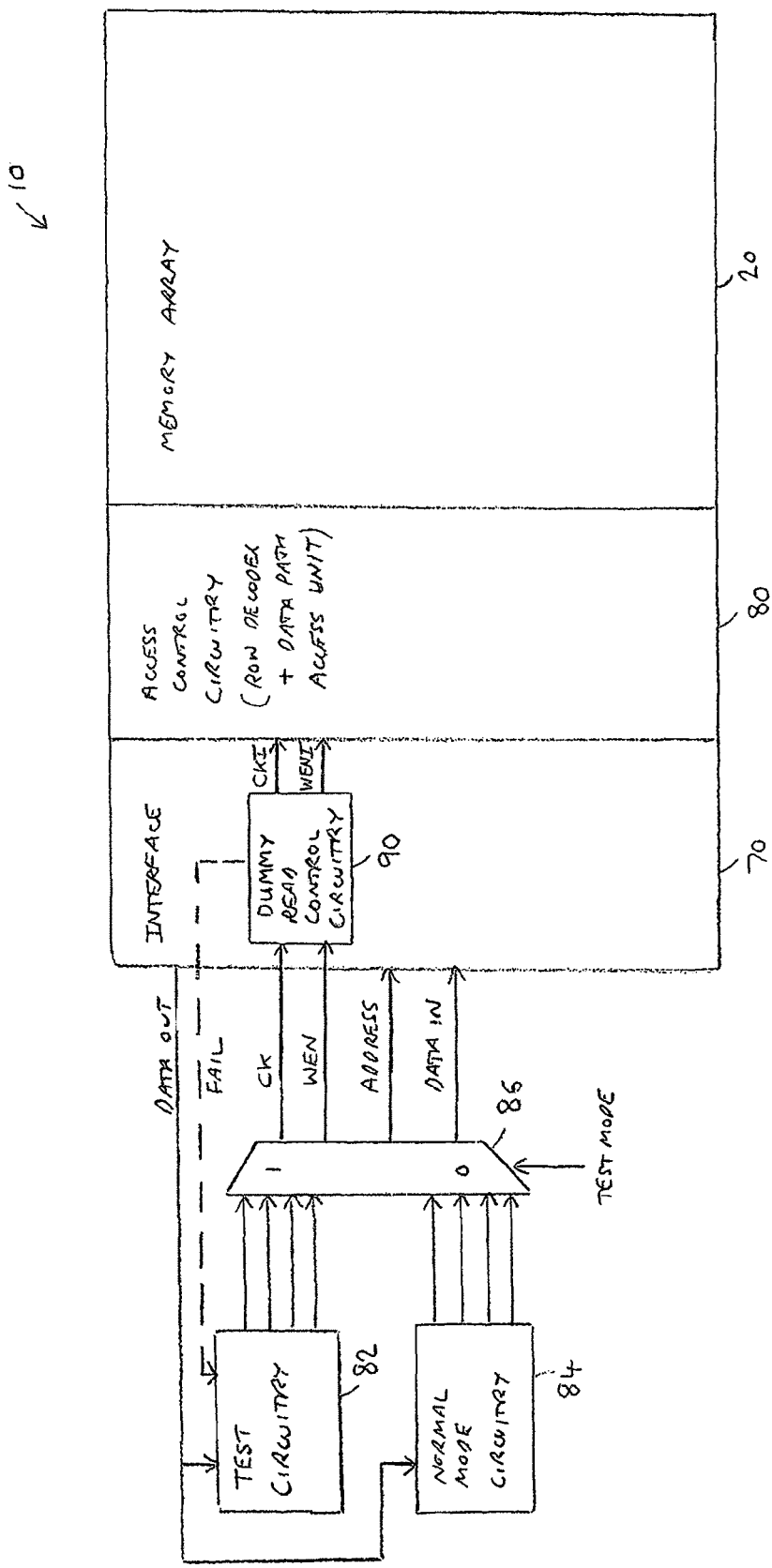
FIG. 4 is a block diagram illustrating the use of dummy read control circuitry in a test mode of operation in accordance with one embodiment of the present invention.

In accordance with one embodiment of the present invention, such a test procedure is performed using the circuitry illustrated schematically in FIG. 4. As shown in FIG. 4, the memory device 10 consists of the memory array 20, access control circuitry 80 (which includes the row decoder 30 and data path access unit 40 of FIG. 1), and interface circuitry 70. In one embodiment, dummy read control circuitry 90 is provided within the interface 70 which is used in a test mode of operation to implement a reliable, effective and realistic (in terms of test time) mechanism for detecting memory cells which may malfunction in normal use due to cell instability caused by the history effect.

In normal use of the memory device, the standard circuitry which interfaces with the memory device, for example a processor core and associated cache, a direct memory access (DMA) engine, etc. (referred to collectively as normal mode circuitry 84 in FIG. 4), will route a variety of signals to the interface 70 of the memory array 10 via multiplexer 86. In particular, the memory array will receive via the interface a clock signal, and for every access request issued by the normal mode circuitry 84 will also receive a memory address, and a write enable (WEN) signal, the write enable signal in one embodiment being set to a logic zero level to indicate a write access, and being cleared to a logic one level to identify a read access. For a write access, a "data in" signal will also be provided specifying the data to be written. For a read access, no data in signal will be provided, and in due course a "data out" signal will be produced by the memory device 10 providing the data accessed from the addressed cells in the memory array 20. In the normal mode of operation, the dummy read control circuitry 90 is not used.

However, in a test mode of operation, test circuitry 82 is coupled via the multiplexer 86 to the interface 70 of the memory device, the test circuitry executing one or more test patterns causing a sequence of access requests to be issued to the memory device. When in the test mode of operation, a test mode clock signal will be used to control the issuance of the sequence of access requests from the test circuitry 82 to the interface 70, and in one embodiment the test mode clock signal runs at half the frequency of the clock signal used during normal operation.

The test circuitry can run a variety of known test patterns in order to seek to detect particular errors in the memory device 10. Further, in order to enable detection of cell instability caused by body region history effect, it is sufficient when using this embodiment of the present invention for those test patterns to perform a write operation to each memory cell, followed at some subsequent point in time by a read operation from each memory cell. It is not important in what order the sequence of writes and the sequence of reads are performed, provided that for each memory cell that memory cell is written to before it is read from. Further, for reasons that will be discussed in more detail later, the exact timing between the write to a memory cell and the subsequent read from the memory cell is not important.

For each write access request issued during the test mode of operation, the dummy read control circuitry is arranged to cause a write operation to the addressed memory cell(s), immediately followed by a dummy read operation from the same memory cell(s). To achieve this, the dummy read control circuitry generates an internal clock signal having an increased frequency with respect to the test mode clock signal, in one embodiment the internal clock signal being twice the frequency of the test mode clock signal. Further, the dummy read control circuitry generates an internal write enable signal from the write enable signal provided via the multiplexer 86. In particular, in one embodiment, the dummy read control circuitry causes a write operation to occur during a first internal clock cycle, immediately followed by a dummy read operation in the second internal clock cycle.

As mentioned earlier, a memory cell will be in its least stable state immediately following the write operation, and hence by performing a dummy read operation immediately following the write operation, this serves to stress the addressed memory cell with respect to cell stability. In particular, if there was a chance that the memory cell might malfunction in normal use due to cell instability, it will be caused to malfunction as a result of the dummy read operation. A further read operation is then required later in the test to read the contents of the memory cell to check whether the dummy read operation did in fact cause the stored state of the memory cell to flip, but the exact timing of this later read operation is not important. Hence, provided that the test circuitry executes one or more test patterns which cause each memory cell to be written to, and each memory cell to be read from at some point after that memory cell has been written to, then those cells which may fail due to cell instability caused by the history effect will be reliably detected as a result of the extra read operation inserted by the dummy read control circuitry immediately after each write operation.

In a first embodiment, the dummy read control circuitry 90 is arranged to only generate the higher frequency internal clock signal for each write access request, and any read access requests specified by the test circuitry will be performed in accordance with the frequency of the test mode clock signal. However, in an alternative embodiment, to simplify implementation, the higher frequency internal clock signal is used for all access requests performed during the test mode of operation, whether write or read, and as a result two read operations will be performed for every read access request specified by the test circuitry. As will be discussed in more detail later, in this second embodiment the dummy read control circuitry 90 is also arranged to perform some analysis based on the data values read as a result of the two read operations, and to issue a fail signal to the test circuitry in the event that the two data values read as a result of the two consecutive read operations differ.

Figure 5A:
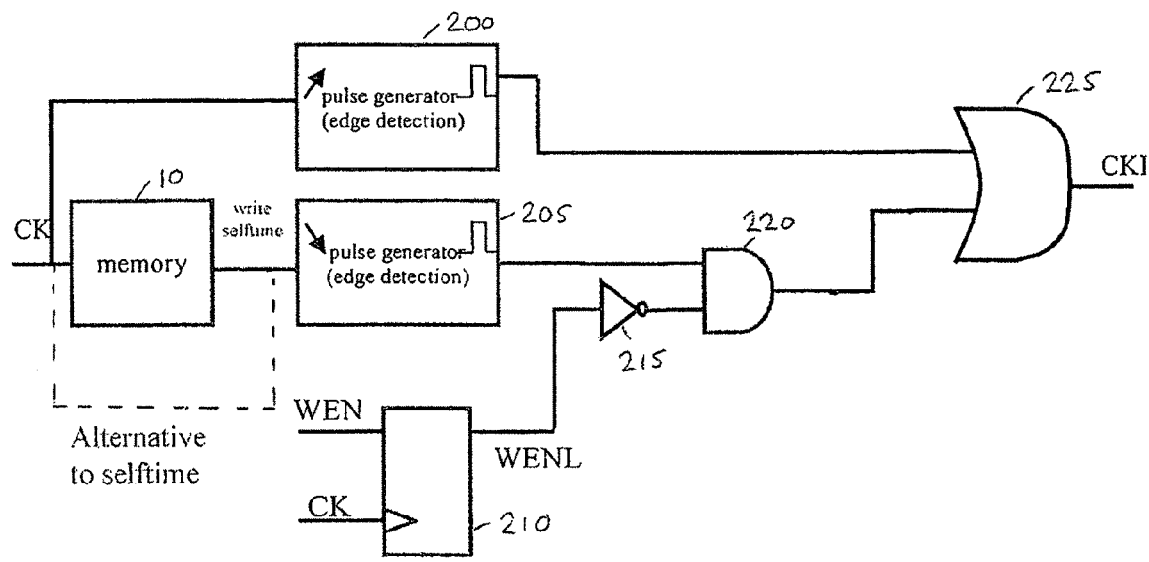
FIG. 5A illustrates clock frequency multiplying circuitry used within the dummy read control circuitry to produce an internal clock signal, in accordance with a first embodiment of the present invention.

FIG. 5A illustrates one embodiment of clock frequency multiplying circuitry that may be used within the dummy read control circuitry in accordance with one embodiment of the present invention. The test mode clock signal is provided as an input to the pulse generator 200, which every time it sees a rising edge of the test mode clock signal produces a pulse to form a "high" phase of the internal clock signal. Further, pulse generator 205 is provided which in one embodiment receives a write self time signal output by the memory device 10 on completion of a write operation. On a falling edge of the write self time signal, the pulse generator generates a pulse identical to the pulse generated by the pulse generator 200, this pulse being output to form another high phase of the internal clock signal if the other input of AND gate 220 is set to a logic one level.

As shown by the dotted line in FIG. 5A, the pulse generator 205 may be arranged to receive the test mode clock signal itself instead of the write self time signal output by the memory device 10, and on each falling edge of the test mode clock signal may be arranged to generate the pulse.

As also shown in FIG. 5A, a flip-flop 210 is provided which receives as its input the write enable signal output from the multiplexer 86 of FIG. 4, the flip-flop 210 being controlled by the test mode clock signal. In particular, on the rising edge of every test mode clock signal, the write enable signal value is output from the flip-flop 210 as the internal signal WENL, with that value then being inverted by inverter 215 prior to input to the AND gate 220. The OR gate 225 is then used to output the internal clock signal at a logic one ("high") level whenever a logic one level is provided at one or both of its inputs.

Figure 7:
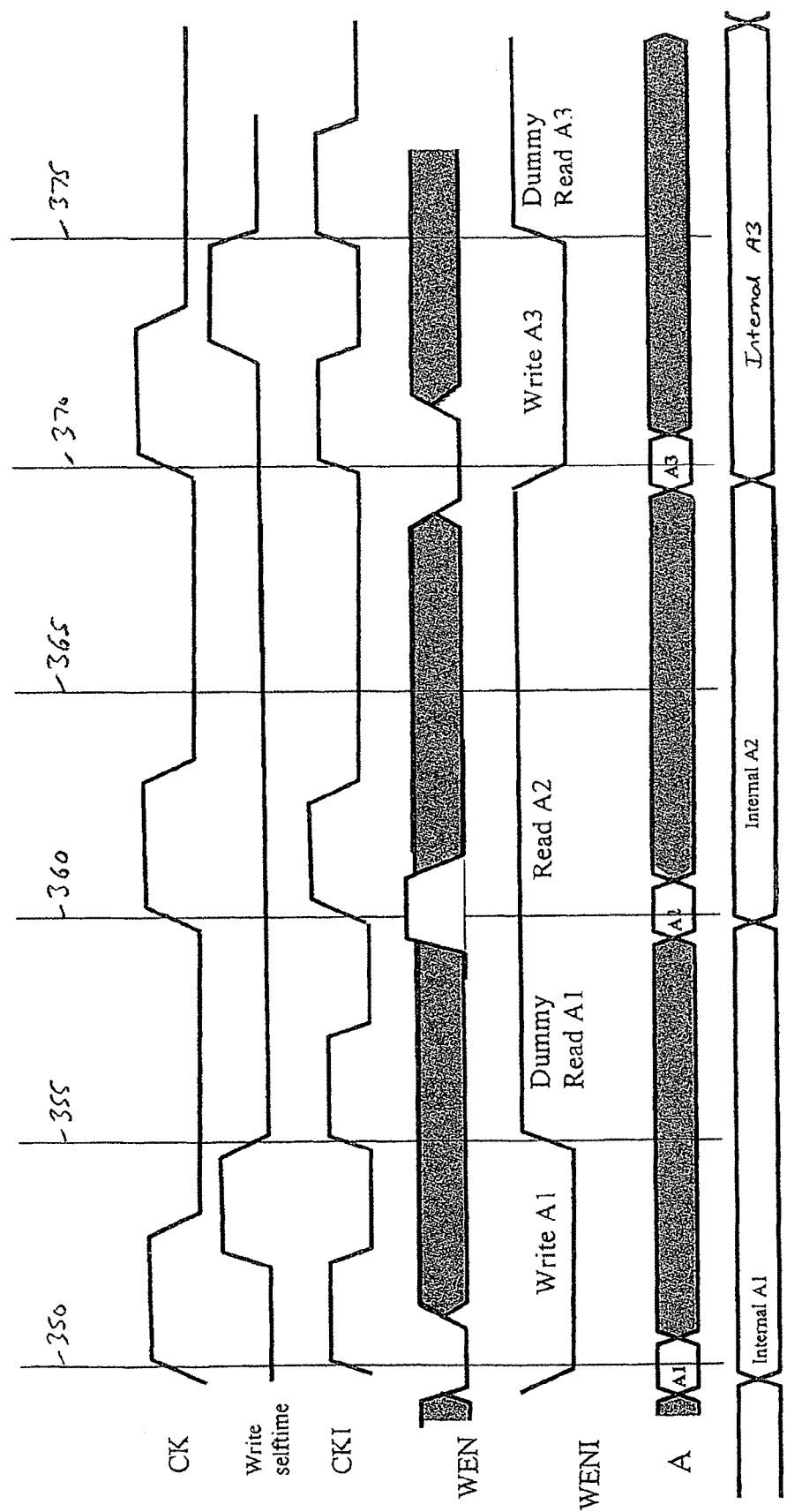
FIG. 7 is a timing diagram illustrating various signals generated in accordance with the first embodiment of the present invention.

The operation of the circuitry of FIG. 5A can be demonstrated further by considering the top three lines of the timing diagram of FIG. 7, in the embodiment of FIG. 7 it being assumed that the pulse generator 205 is operating from the write self time signal provided from the memory device 10. At time 350, the rising edge of the test mode clock signal causes the pulse generator 200 to generate a pulse which is output via OR gate 225 to form the "high" phase of the internal clock signal CKI. At time 355, the falling edge of the write self time signal causes the pulse generator 205 to output a pulse. Further, because at time 350 the write enable signal was at a logic zero level, this will have caused the flip-flop 210 to output a logic zero level signal, which will have been inverted by inverter 215 to form a logic one input to the AND gate 220. Accordingly, the pulse generated by the pulse generator 205 is propagated on via the AND gate 220 and the OR gate 225 to form the next "high" phase of the internal clock signal at point 355.

At time 360, the pulse generator 200 again detects a rising edge of the test mode clock signal, causing another pulse to be generated to form the next high phase of the internal clock signal. However, since at point 360 the write enable signal is high, the flip-flop 210 will have output a logic one signal which will have been inverted by inverter 215 to form a logic zero value input to AND gate 220. Accordingly, irrespective of the input to the pulse generator 205, following the pulse issued at step 360 the internal clock signal will then stay at a low level until time 370. Accordingly, it can be seen that whilst the internal clock signal has an increased frequency for the write operation, its frequency is not increased for the read operation. The transitions at time 370 and 375 are then identical to the transitions that occurred at times 350 and 355, in this latter case these signals being generated for the write to address A3.

Figure 5B:
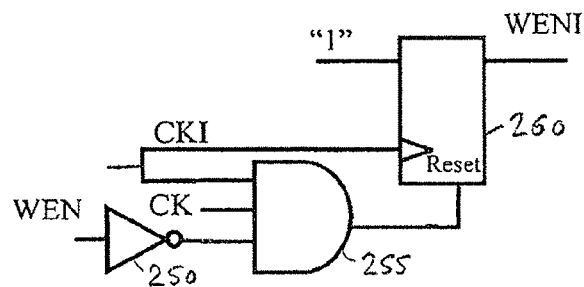
FIG. 5B illustrates circuitry provided within the dummy read control circuitry of the first embodiment of the present invention in order to generate an internal write enable signal.

FIG. 5B illustrates some circuitry provided within the dummy read control circuitry 90 of FIG. 4 in accordance with one embodiment, to generate an internal write enable signal WENI. On the rising edge of the internal clock signal, the flip-flop 260 outputs a logic one value as the WENI signal, but every time a logic one value is input to the reset pin, the WENI signal is transitioned to a logic zero level. The AND gate 255 will cause a logic one value to be applied to the reset pin of the flip-flop whenever both the test mode clock signal and the internal clock signal are at a high level, and the write enable signal is at a logic zero level, this write enable signal being inverted by the inverter 250 prior to being input to the third input of the AND gate 255. Hence, looking at FIG. 7, it can be seen that at time 350, the AND gate 255 will output a logic one value, and will accordingly cause the WENI signal to transition to a logic zero level. However, at time 355, the output from the AND gate 255 will be at a logic zero level, and accordingly the rising edge of the internal clock signal will cause the WENI signal to transition to a logic one level. The WENI signal will then be maintained at a logic one level until time 370, where again the reset input to the flip-flop 260 will be set causing the WENI signal to transition to a logic zero level until time 375.

Hence, considering FIG. 7, it can be seen that in response to each write access request, the dummy read control circuitry 90 doubles the frequency of the internal clock signal, and causes the WENI signal to go low for a first internal clock signal and high for a second internal clock signal, thereby causing the write operation to be followed by a dummy read operation. In accordance with this first embodiment, it can be seen that for any read operation, the frequency of the internal clock signal is not increased, and instead the read operation proceeds in the standard manner.

The address input (A) shows the address value provided to the memory interface 70 from the multiplexer 86 of FIG. 4, whilst the bottom line of FIG. 7 shows the address value that is then asserted internally to the access control circuitry 80 of FIG. 4.

Figure 6:
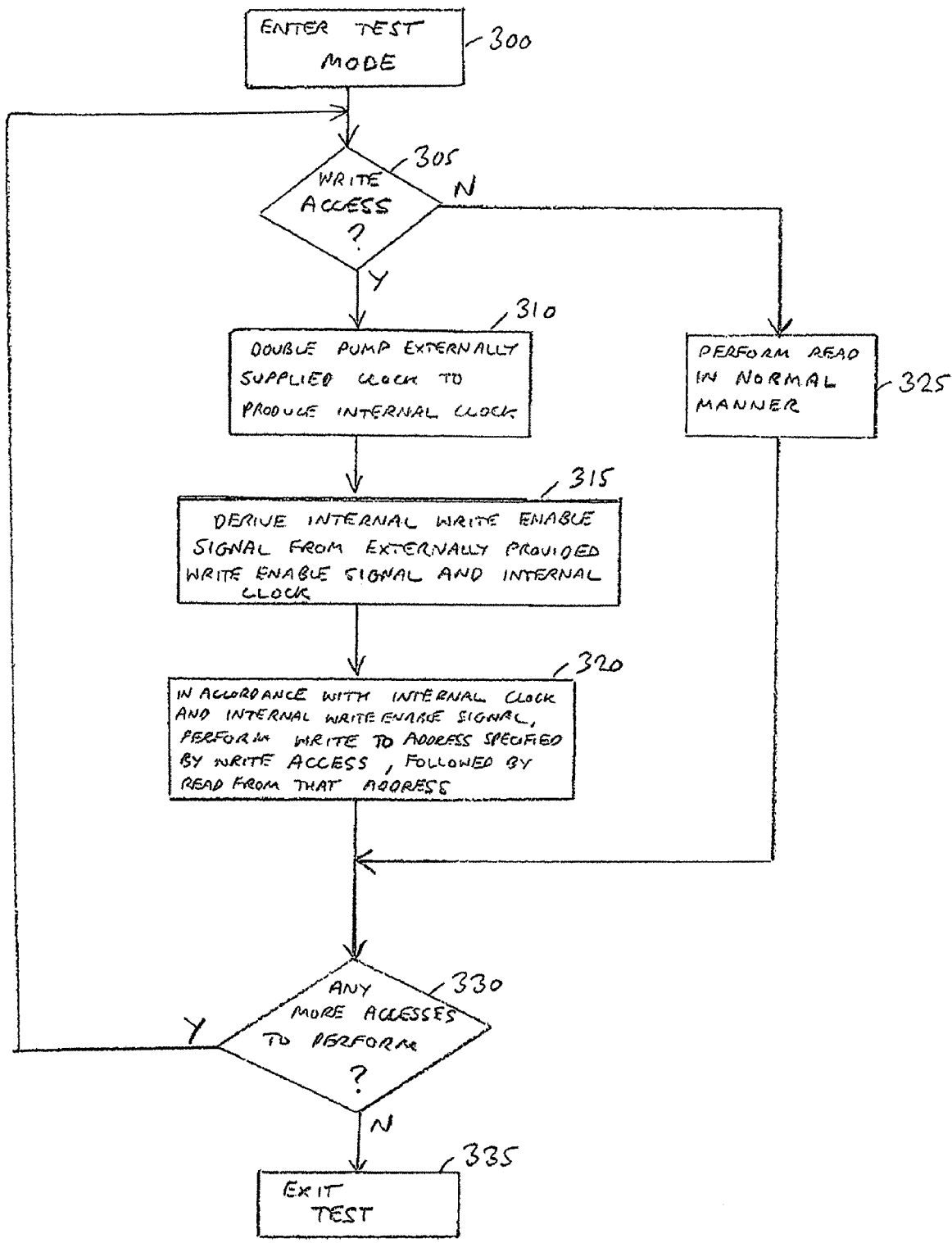
FIG. 6 is a flow diagram illustrating the operation of the dummy read control circuitry in accordance with the first embodiment of the present invention.

The operation of the dummy read control circuitry 90 in accordance with this first embodiment of the present invention is illustrated by way of example with reference to the flow diagram of FIG. 6. On entering the test mode at step 300, the dummy read control circuitry 90 awaits an access request issued from the test circuitry 82. At step 305, it is then determined whether the access request received is a write access or a read access. If it is a read access, then the process proceeds to step 325 where the read operation is performed in the usual manner. However, in the event of a write access, the clock frequency multiplying circuitry of FIG. 5A is used to double pump the internally supplied clock to produce an increased frequency internal clock. Further, at step 315, an internal write enable signal is derived from the externally provided write enable signal and the internal clock, this being achieved using the circuitry of FIG. 5B discussed earlier.

As a result of steps 310 and 315, then at step 320 the internal clock and internal write enable signal are used to cause a write operation to be performed to the address specified by the write access request, followed by a read from that address. Accordingly, as a result of this step, one or more memory cells will have data written to them, and then immediately following that write operation a read operation will be performed in order to read the data out of those addressed memory cells. This data read as a result of the dummy read operation is not in itself used, but instead merely serves to stress the addressed memory cells with respect to cell stability, causing any memory cells that could fail in normal use due to cell instability to fail at this point. However, such a failure is not detected at that time, and instead the failure will be detected as a result of some subsequent read operation performed during the test procedure performed by the test circuitry 82.

Following step 320, or following step 325 in the event of a read operation, it is determined at step 330 whether there are any more accesses to be performed by the test circuitry, and if so the dummy read control circuitry 90 awaits a further access at step 305. In the event that there are no further accesses to be performed, then the process proceeds from step 330 to step 335 where the test procedure is exited. At this point, the test circuitry 82 will have performed write access requests to a sequence of memory cells, and will also have read data from those memory cells. By determining whether there is any difference between the data written to a memory cell and the data later read from the memory cell, defective memory cells can be identified. Hence, if for a particular memory cell the dummy read operation caused the stored state of that memory cell to flip, then a subsequent read operation performed in respect of that memory cell will result in the data read to be determined to be different from the data originally written, and accordingly such a memory cell can be identified as a defective cell.

Figure 8A:
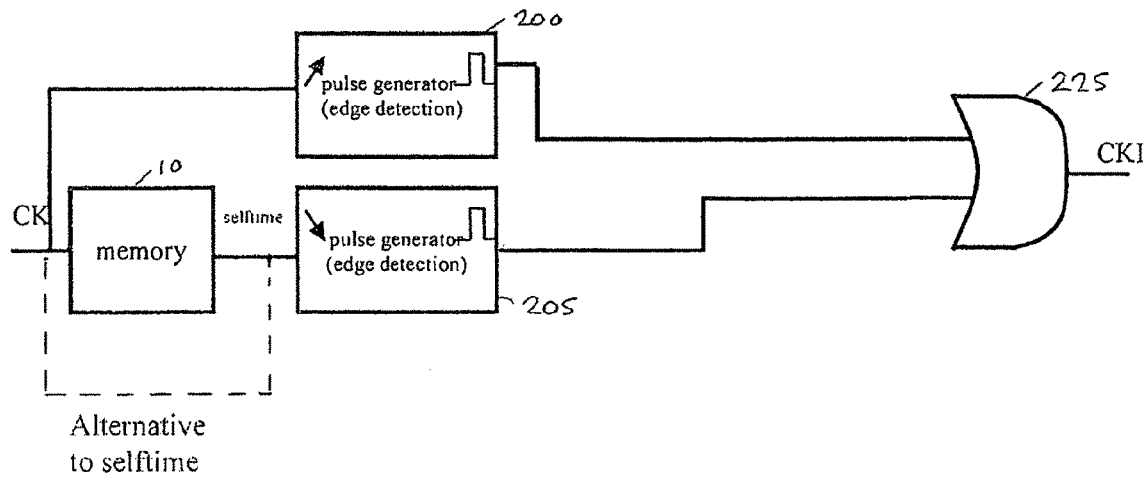
FIG. 8A illustrates clock frequency multiplying circuitry used within the dummy read control circuitry for generating the internal clock signal, in accordance with a second embodiment of the present invention.
Figure 8B:
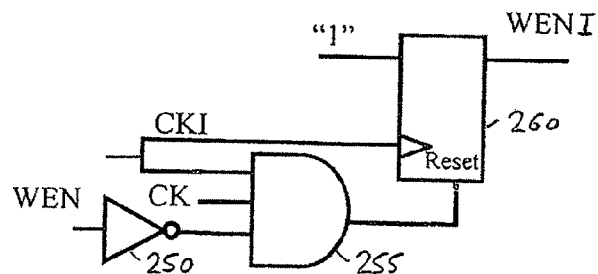
FIG. 8B illustrates circuitry provided within the dummy read control circuitry of the second embodiment of the present invention for generating an internal write enable signal.
Figure 8C:
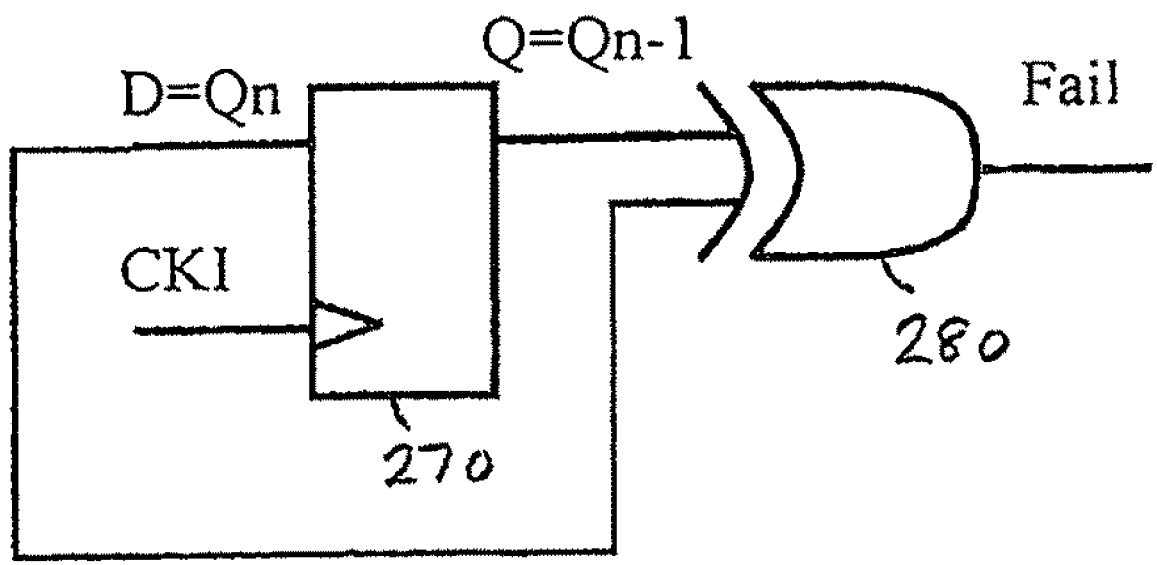
FIG. 8C illustrates circuitry provided within the dummy read control circuitry in accordance with the second embodiment of the present invention to detect a fail condition when performing two read operations in response to a read access request issued by the test circuitry.

FIGS. 8A to 8C show the construction of the dummy read control circuitry 90 in accordance with an alternative embodiment of the present invention. In this embodiment, the internal clock signal is double pumped for both write and read access requests. Accordingly, there is no need to suppress any of the pulses generated by the pulse generator 205 from the self time signal (here the self time signal being produced for both write and read operations), or from the falling edge of the test mode clock signal if that is used instead of the write self time signal. As a result, there is no need for the flip-flop 210, inverter 215 and AND gate 220 shown in the earlier example of FIG. 5A, and instead any pulse generated by either the pulse generator 200 or the pulse generator 205 form a high phase of the internal clock signal via the OR gate 225. This is illustrated schematically for the example timing diagram of FIG. 10, where it can be seen that the internal clock signal CKI operates at twice the frequency of the test mode clock signal for both write and read operations.

Figure 10:
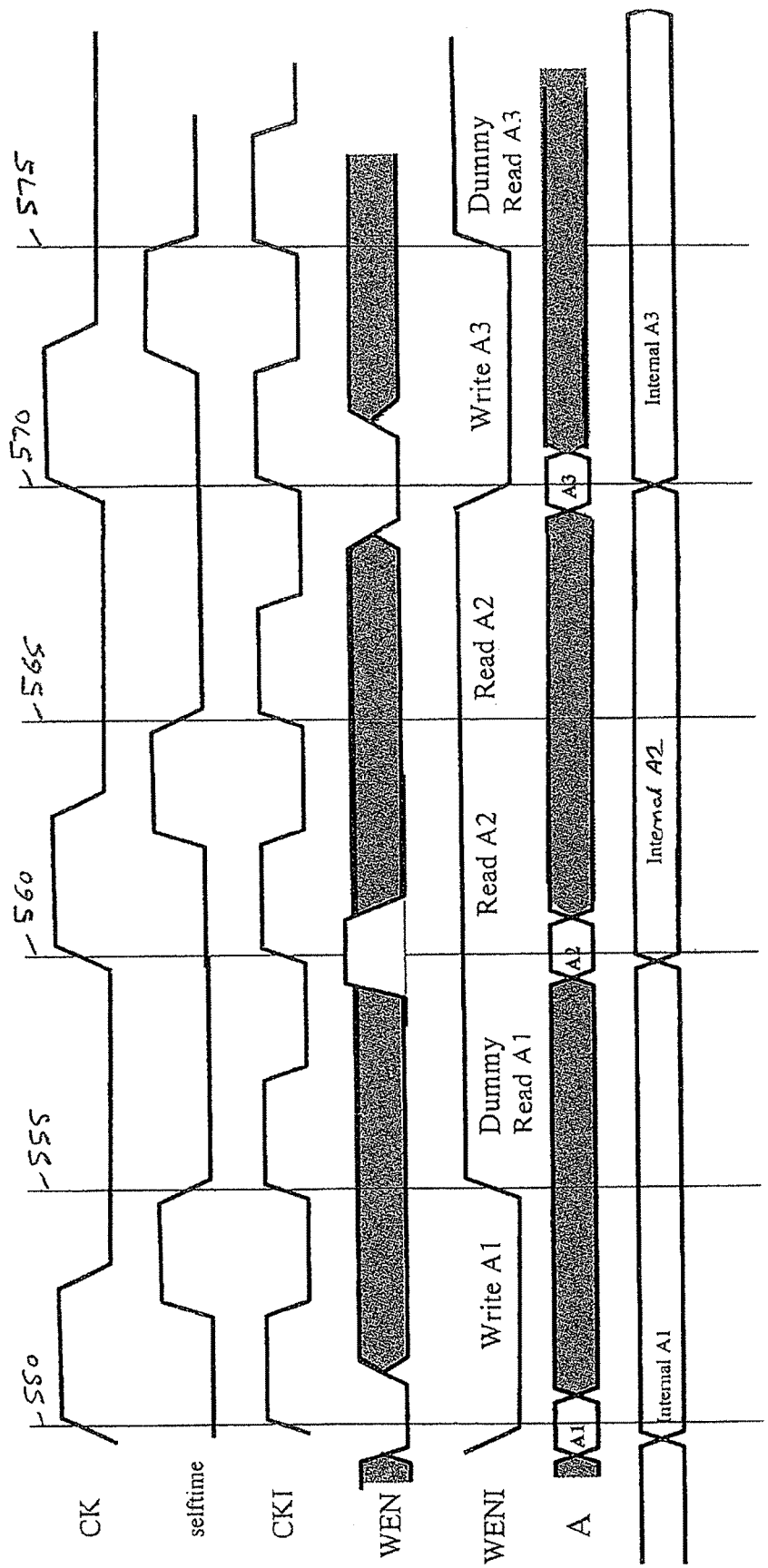
FIG. 10 is a timing diagram illustrating various signals generated in accordance with the second embodiment of the present invention.

The circuitry provided within the dummy read control circuitry 90 to produce the internal write enable signal WENI is shown schematically in FIG. 8B. It will be appreciated from a comparison of FIG. 8B with FIG. 5B that this part of the dummy read control circuitry is unchanged between the first and the second embodiments, and accordingly operates in the same manner as that discussed earlier with reference to FIG. 5B. Hence, as shown in the example of FIG. 10, the internal write enable signal WENI is identical to that produced in the example of FIG. 7. In particular, even though the internal clock signal CKI of FIG. 10 also has a rising edge at the time 565, when such a rising edge was not present in the example of FIG. 7, this merely causes the flip-flop 260 to continue to assert the WENI signal at a logic one level, since no reset signal will be provided from the AND gate 255 at that time.

As will be seen from a comparison of FIG. 7 and FIG. 10, the main difference between the two embodiments is that for a read access request, two read operations are performed internally within the memory device, shown in FIG. 10 as "read A2". It is actually the output from the second read operation that is sampled by the test circuitry 82. If this read operation relates to a memory cell that had previously been written to via a write operation and associated dummy read operation, then it is possible for a defective cell that both the dummy read operation following the original write operation, and the first of the two read operations performed in response to the read access request, both cause the state of the memory cell to flip due to cell instability. If that sequence of events does occur, when the final read operation of the pair of read operations takes place, then (irrespective of whether that final read operation again causes a flip of the state) the value read from the cell as a result of that final read operation will be the value stored in the memory cell after the immediately preceding read operation. This value may hence be the value after two flips of state have taken place, and accordingly may match the original written value.

To detect such a situation, the circuitry of FIG. 8C can in one embodiment be provided within the dummy read control circuitry 90. As shown, each data value read from a memory cell is stored in a flip-flop 270 which on the rising edge of the internal clock signal outputs that value to one input of an XOR gate. The other input of the XOR gate receives the read data value directly. Accordingly, at the time of the second read operation initiated at time 565, the first data value read during the preceding clock cycle will be output from the flip-flop 270 to the XOR gate, with the other input of the XOR gate receiving the data value read as a result of the second read operation. In the event that the two inputs differ, the XOR gate will output a set fail signal at a logic one value to indicate a fail condition, whereas otherwise a logic zero value will be output indicating that there is no fail condition. This fail signal is routed back to the test circuitry 82 as shown schematically in the earlier-mentioned FIG. 4, and is used by the test circuitry 82 as an additional indicator of a defective memory cell. In particular, even if the data value received by the test circuitry from the read access request matches the data value written as a result of the previous write access request, then if the fail signal is set the test circuitry 82 will identify the relevant memory cell as defective.

Figure 9:
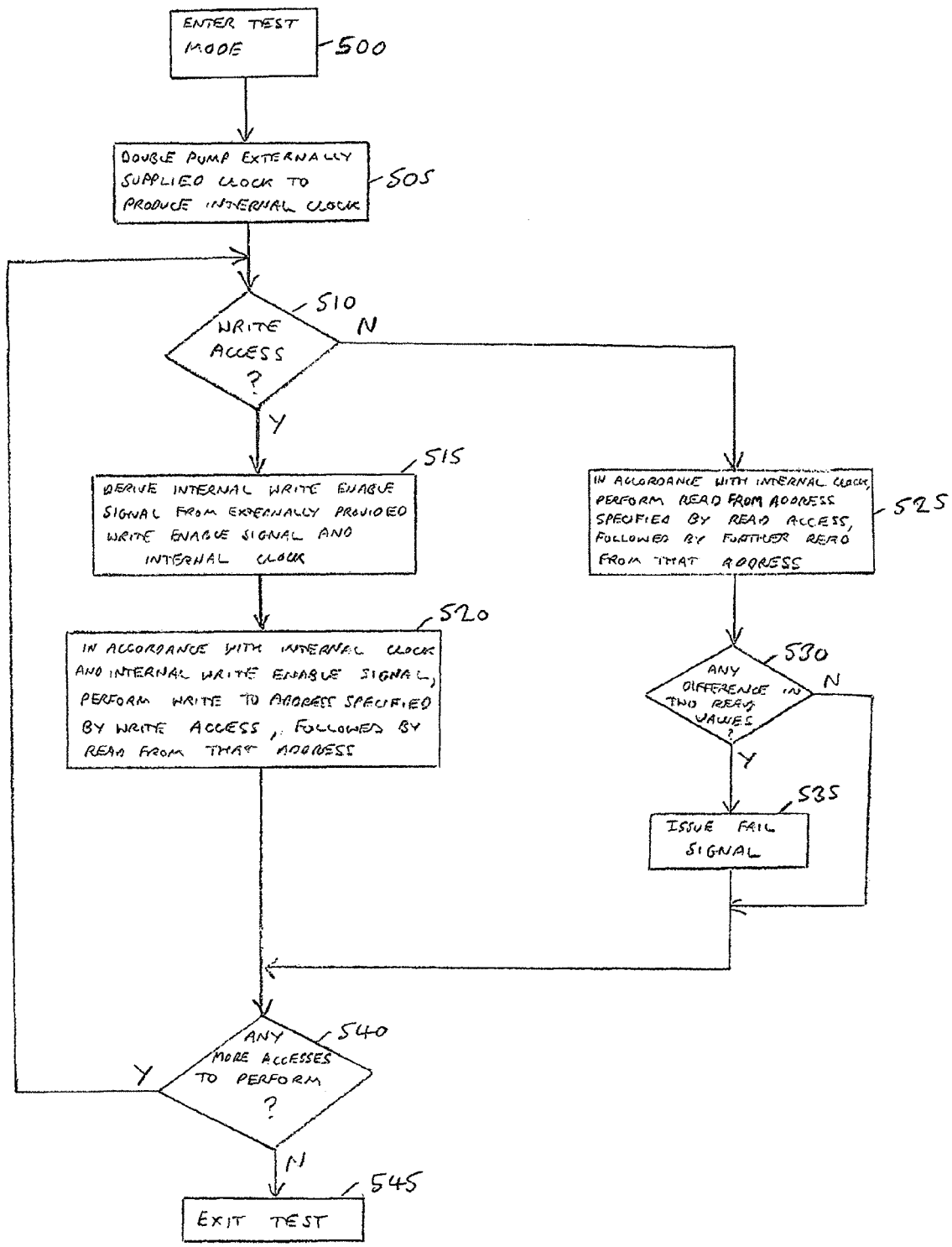
FIG. 9 is a flow diagram illustrating the operation of the dummy read control circuitry in accordance with the second embodiment of the present invention.

FIG. 9 is a flow diagram illustrating the operation of the dummy read control circuitry 90 in accordance with this second embodiment of the present invention. Write accesses are handled in the same manner as in the first embodiment, and accordingly steps 500, 505, 510, 515, 520, 540 and 545 correspond to the steps 300, 310, 305, 315, 320, 330 and 335 of FIG. 6 discussed earlier. However, for a read access request, the process branches to step 525 where, in accordance with the double pumped internal clock, a first read operation is performed from the address specified by the read access, immediately followed by a further read operation from that address. Thereafter, it is determined at step 530 using the circuitry of FIG. 8C whether there is any difference in the two read values, and if so a set fail signal is issued at step 535. Thereafter, the process proceeds to step 540, or proceeds directly to step 540 from step 530 if the two read values are the same.

Figure 11:
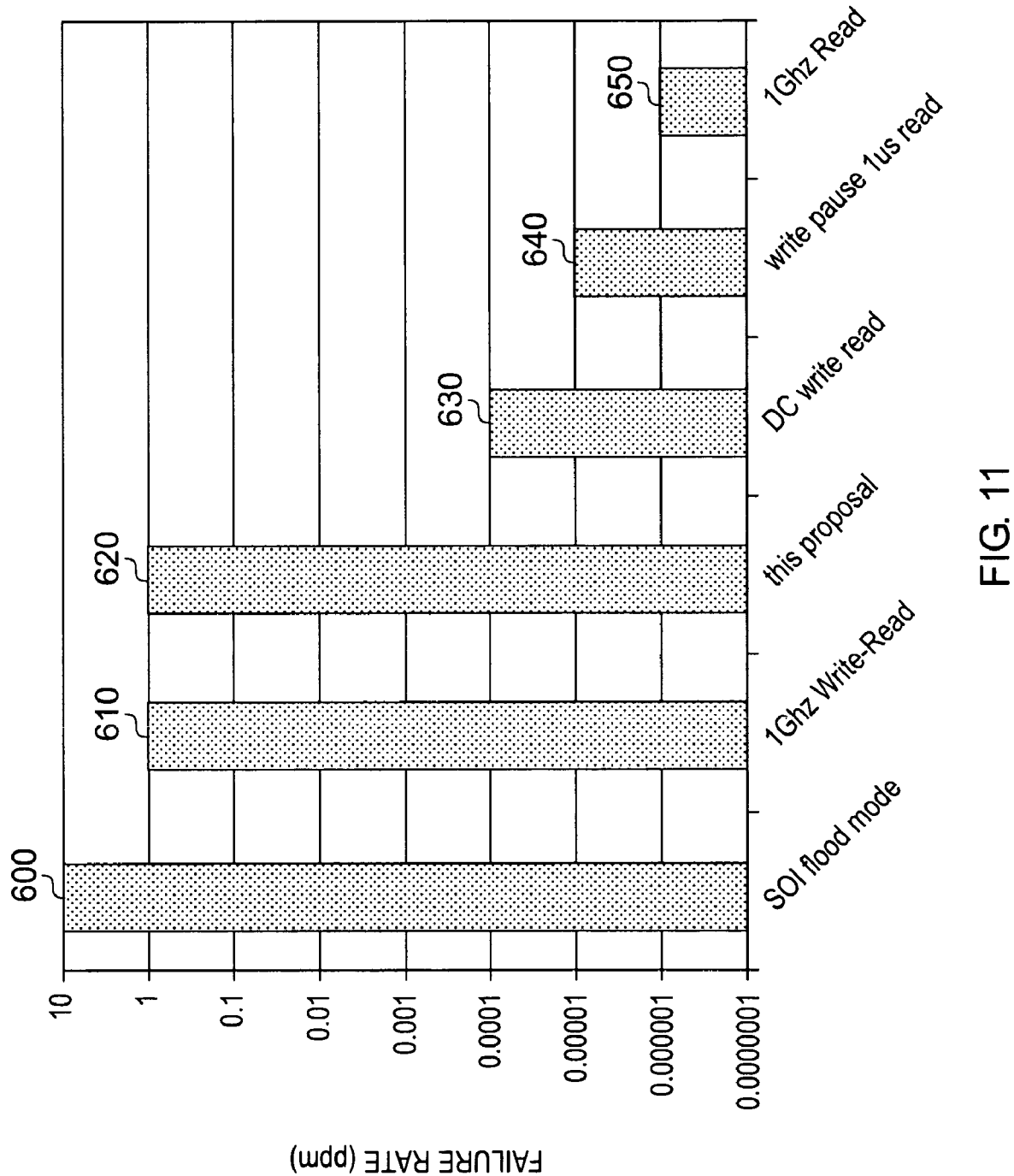
FIG. 11 illustrates detected failure rates due to history effect on cell stability for a variety of techniques.

FIG. 11 is a chart illustrating the failure rate in parts per million observed for various access sequences. The bar 610 illustrates the failure rate that might be expected in normal operation of a memory device operating at 1 Ghz, where a write access request is followed by a read access request, this showing a failure rate of approximately one cell per million cells. In contrast, bar 650 shows the failure rate if only read operations are performed using a 1 Ghz clock. As expected, the failure rate is significantly less since the voltage potential in the body region of the memory cells will have stabilised to a level which is aligned with the data stored in the memory cell, and accordingly the history effect does not give rise to cell stability problems.

The bar 630 illustrates the failure rate for DC write-read sequences, i.e. sequences where an independent read operation is separated by a long period of time from a preceding independent write operation. The bar 640 shows the failure rate that might be identified using a known prior art BIST procedure where a known test pattern is executed, and in particular shows an example where the read operation to a memory cell previously written to takes place one microsecond after the write operation. As mentioned earlier, due to the time gap between the write operation and the subsequent read operation, the voltage in the body region of the transistors of the memory cell will have had a chance to re-stabilise, and accordingly by the time the read operation takes place the memory cell is more stable than it would have been had the read followed immediately after the write. As a result, it can be seen that the detected failure rate is significantly less than that would be expected in normal operation (as shown by the bar 610).

Similarly, the bar 600 shows the expected failure rate when using the prior art flood mode technique. The exact failure rate will be dependent on the duration of the flood mode, but as discussed previously it is likely that more cells will be detected to fail than would actually fail in normal use, in this particular example ten times as many cells being detected as would actually fail.

As shown by the bar 620, when using the techniques of embodiments of the present invention, the detected failure rate closely follows the actual failure rate that would be expected in normal use, and hence can be seen to provide a very reliable and effective mechanism for detecting cells that may malfunction in normal use due to instability caused by the history effect.

From the above description of embodiments of the present invention, it can be seen that such embodiments provide a DesignForTest (DFT) mechanism that can be used in SOI SRAM devices for screening weak bit cells having regard to cell stability. In accordance with the techniques of embodiments of the present invention, weak bit cells are screened transparently by inserting a dummy read operation immediately after each write operation so as to stress each addressed memory cell having regard to cell stability. For this purpose, a double pumped internal clock signal is generated. As a result, the test mode of operation can be run at a low frequency (for example half the normal operating frequency) whilst keeping accurate test coverage for normal operation conditions. This technique thus models the actual SOI history behaviour of the SRAM cells that would occur in normal operation.

The techniques of embodiments of the present invention may be applied in respect of all memory devices whose memory cells are constructed using transistors having a body region insulated from a substrate, and accordingly may be applied not only to single ported memory devices, but also to multi-ported memory devices.

Finally, it will be appreciated that whilst, for the purposes of describing an embodiment of the present invention, it is assumed that the transistors are constructed using SOI technology, the same concept can be applicable to any other technologies where the devices are produced with body regions insulated from the substrate, as for example may be the case for triple-well devices constructed using bulk technology.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:
    a memory device having an array of memory cells for storing data values;
    test circuitry employed in a test mode of operation to execute one or more test patterns in order to detect any defective memory cells which, due to cell instability following a write operation, will malfunction in a normal mode of operation if a read operation follows said write operation, each test pattern causing a sequence of access requests to be issued to the memory device, where the timing of said sequence is controlled by a test mode clock signal; and
    dummy read control circuitry employed in the test mode of operation, and responsive at least to each write access request in the sequence of access requests, to generate an internal clock signal which has an increased frequency with respect to the test mode clock signal, the dummy read control circuitry further, responsive to each write access request, to perform using the internal clock signal a write operation to at least one memory cell based on a memory address specified by the write access request, followed by a dummy read operation to the same at least one memory cell, the dummy read operation serving to stress the at least one memory cell with respect to cell stability, but with a result of the dummy read operation not being used by the test circuitry, whereby the dummy read operation causes said malfunction of any said defective memory cells to which said write operation is performed, such that a later read operation issued by said one or more test patterns to those defective memory cells will cause said malfunction to be detected irrespective of any delay between said write operation and said later read operation.

2. A data processing apparatus as claimed in claim 1, wherein each memory cell comprises at least one transistor having a body region insulated from a substrate, and the cell instability following a write operation is caused by body region history effect.

3. A data processing apparatus as claimed in claim 1, wherein the dummy read control circuitry comprises:
    clock frequency multiplying circuitry for generating the internal clock signal from the test mode clock signal; and
    write control signal generation circuitry for generating, from the internal clock signal and from a write enable signal provided with each write access request, an internal write enable signal, the internal write enable signal being set for at least one cycle of the internal clock to cause said write operation to be performed, and being cleared for at least one subsequent cycle of the internal clock to cause said dummy read operation to be performed.

4. A data processing apparatus as claimed in claim 3, wherein said clock frequency multiplying circuitry generates said internal clock signal having a frequency twice that of the test mode clock signal.

5. A data processing apparatus as claimed in claim 4, wherein said test mode clock signal is half the frequency of a normal mode clock signal used in said normal mode of operation.

6. A data processing apparatus as claimed in claim 4, wherein the internal write enable signal is set for a first cycle of the internal clock to cause said write operation to be performed, and is cleared for a second cycle of the internal clock to cause said dummy read operation to be performed.

7. A data processing apparatus as claimed in claim 3, wherein the clock frequency multiplying circuitry is arranged to receive a write self timing signal generated within the memory device to indicate completion of the write operation, and to use that write self timing signal when generating the internal clock.

8. A data processing apparatus as claimed in claim 3, wherein the clock frequency multiplying circuitry comprises edge detection circuitry for detecting rising and falling edges of the test mode clock signal, and for generating said internal clock in dependence on said detected rising and falling edges.

9. A data processing apparatus as claimed in claim 1, wherein:
   said one or more test patterns specify a sequence of write access requests to a plurality of memory cells, and specify an associated sequence of read access requests to said plurality of memory cells, for each memory cell in said plurality the specified write access request being performed before the specified read access request; and
   for any memory cell amongst said plurality for which the data read from that memory cell as a result of the specified read access request differs from the data written to that memory cell as a result of the specified write access request, said test circuitry determining that memory cell to be a defective memory cell which will malfunction in said normal mode of operation due to cell instability following a write operation.

10. A data processing apparatus as claimed in claim 9, wherein:
    the dummy read control circuitry generates the internal clock signal for both the write access requests and the read access requests specified by said one or more tests patterns;
    the dummy read control circuitry further being responsive to each read access request to perform using the internal clock signal a first read operation from at least one memory cell based on a memory address specified by the read access request, followed by a further read operation from the same at least one memory cell;
    for any memory cell for which the dummy read control circuitry detects a difference in the data read by the first read operation and the data read by the further read operation, the dummy read control circuitry being arranged to issue a fail signal to the test circuitry; and
    for any memory cell for which the dummy read control circuitry issues said fail signal, said test circuitry determining that memory cell to be a defective memory cell which will malfunction in said normal mode of operation due to cell instability following a write operation, even if the data read by the further read operation is not different to the data written to that memory cell as a result of the specified write access request.

11. A data processing apparatus as claimed in claim 1, wherein the dummy read control circuitry is provided within the memory device.

12. A memory device comprising:
    an array of memory cells for storing data values; and
    dummy read control circuitry;
    in a test mode of operation, one or more test patterns being executed in order to detect any defective memory cells which, due to cell instability following a write operation, will malfunction in a normal mode of operation if a read operation follows said write operation, each test pattern causing a sequence of access requests to be issued to the memory device, where the timing of said sequence is controlled by a test mode clock signal; and
    the dummy read control circuitry, responsive at least to each write access request in the sequence of access requests, to generate an internal clock signal which has an increased frequency with respect to the test mode clock signal, the dummy read control circuitry, responsive to each write access request, to perform using the internal clock signal a write operation to at least one memory cell based on a memory address specified by the write access request, followed by a dummy read operation to the same at least one memory cell, the dummy read operation serving to stress the at least one memory cell with respect to cell stability, but with a result of the dummy read operation not used by test circuitry executing said one or more test patterns, whereby the dummy read operation causes said malfunction of any said defective memory cells to which said write operation is performed, such that a later read operation issued by said one or more test patterns to those defective memory cells will cause said malfunction to be detected irrespective of any delay between said write operation and said later read operation.

13. A method of testing stability of memory cells in a memory device, the memory device having an array of memory cells for storing data values, the method comprising the steps of:
    in a test mode of operation, executing one or more test patterns in order to detect any defective memory cells which, due to cell instability following a write operation, will malfunction in a normal mode of operation if a read operation follows said write operation, for each test pattern a sequence of access requests being issued to the memory device, where the timing of said sequence is controlled by a test mode clock signal;
    responsive at least to each write access request in the sequence of access requests, generating an internal clock signal which has an increased frequency with respect to the test mode clock signal; and
    responsive to each write access request, performing using the internal clock signal a write operation to at least one memory cell based on a memory address specified by the write access request, followed by a dummy read operation to the same at least one memory cell, the dummy read operation serving to stress the at least one memory cell with respect to cell stability, but with a result of the dummy read operation not used by test circuitry executing said one or more test patterns, whereby the dummy read operation causes said malfunction of any said defective memory cells to which said write operation is performed, such that a later read operation issued by said one or more test patterns to those defective memory cells will cause said malfunction to be detected irrespective of any delay between said write operation and said later read operation.

14. A data processing apparatus comprising:
    memory means having an array of memory cell means for storing data values;
    test means employed in a test mode of operation for executing one or more test patterns in order to detect any defective memory cell means which, due to cell instability following a write operation, will malfunction in a normal mode of operation if a read operation follows said write operation, each test pattern causing a sequence of access requests to be issued to the memory means, where the timing of said sequence is controlled by a test mode clock signal; and
    dummy read control means employed in the test mode of operation, and responsive at least to each write access request in the sequence of access requests, for generating an internal clock signal which has an increased frequency with respect to the test mode clock signal, the dummy read control means, responsive to each write access request, for performing using the internal clock signal a write operation to at least one memory cell means based on a memory address specified by the write access request, followed by a dummy read operation to the same at least one memory cell means, the dummy read operation serving to stress the at least one memory cell means with respect to cell stability, but with a result of the dummy read operation not used by the test means, whereby the dummy read operation causes said malfunction of any said defective memory cell means to which said write operation is performed, such that a later read operation issued by said one or more test patterns to those defective memory cell means will cause said malfunction to be detected irrespective of any delay between said write operation and said later read operation.

* * * * *